United States Patent
Lee et al.

(10) Patent No.: US 6,448,113 B2
(45) Date of Patent: Sep. 10, 2002

(54) METHOD OF FORMING FUSE AREA STRUCTURE INCLUDING PROTECTION FILM ON SIDEWALL OF FUSE OPENING IN SEMICONDUCTOR DEVICE

(75) Inventors: Chi-hoon Lee; Young-hoon Park; Hyo-dong Ban; Sung-hoon Kho, all of Suwon (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/739,186

(22) Filed: Dec. 18, 2000

(30) Foreign Application Priority Data

Dec. 22, 1999  (KR) ............................................ 99-60356

(51) Int. Cl.⁷ ...................... H01L 21/82; H01L 21/8242
(52) U.S. Cl. ......................................... 438/132; 438/238
(58) Field of Search ................................ 438/132, 128, 438/238, 239; 257/529

(56) References Cited

U.S. PATENT DOCUMENTS

| | | | | |
|---|---|---|---|---|
| 6,004,834 A | * | 12/1999 | Tsukude et al. | ............. 438/132 |
| 6,054,340 A | * | 4/2000 | Mitchell et al. | ............. 257/529 |
| 6,168,977 B1 | * | 1/2001 | Konishi | ....................... 438/132 |

* cited by examiner

Primary Examiner—Michael Sherry
Assistant Examiner—Evan Pert
(74) Attorney, Agent, or Firm—Mills & Onello LLP (57) ABSTRACT

A fuse area structure in a semiconductor device and a method of forming the same are provided. The fuse area structure includes a protection film formed of a passivation film for preventing moisture from seeping into the sidewall of an exposed fuse opening. In order to form the protection film, an etching stop film is formed on a fuse line, and the fuse opening is formed at the same time using the etching stop film when a contact hole required for the semiconductor device is formed. A conductive material layer for forming an upper interconnection layer is formed on the entire surface of a resultant structure on which the contact hole and the fuse opening are formed. The conductive material layer formed on the fuse opening is removed. The exposed etching stop film is removed. Finally, the fuse area is completed by forming a passivation film on the entire surface of the resultant structure and removing the passivation film formed on the bottom of the fuse opening into which laser is to be irradiated. Moisture is effectively prevented from seeping into the interfaces between interlayer dielectric films since the protection film of the passivation film is formed on the sidewall of the fuse opening without an additional process. Also, an additional photolithography process for forming the fuse opening is not necessary since the fuse opening is simultaneously formed when the contact hole is formed.

14 Claims, 8 Drawing Sheets

METHOD OF FORMING FUSE AREA STRUCTURE INCLUDING PROTECTION FILM ON SIDEWALL OF FUSE OPENING IN SEMICONDUCTOR DEVICE

BACKGROUND OF THE INVENTION

1. Field of the Invention

The present invention relates to a semiconductor device and a method of manufacturing the same, and more particularly, to a fuse area structure in a semiconductor device and a method of forming the same.

2. Description of the Related Art

In general, a semiconductor device is realized by stacking various material layer patterns, and the uppermost layer thereof is covered with a passivation film. The passivation film is generally formed of a hard material such as silicon nitride. The passivation film absorbs mechanical, electrical, and chemical shock, thus protecting the semiconductor device.

In general, semiconductor devices such as semiconductor memory devices are subjected to a repair process to replace circuits that do not operate due to defects. The defective circuits are replaced by redundant circuits. Also, semiconductor devices may be subjected to a trimming process to change the characteristics of some circuits such that they are suitable for a particular application. The repair process or the trimming process is performed by cutting part of a predetermined interconnection by irradiating with a laser. The interconnection cut by the irradiating laser is referred to as a fuseline. The cut part and area surrounding it are referred to as a fuse area.

Figure 1:
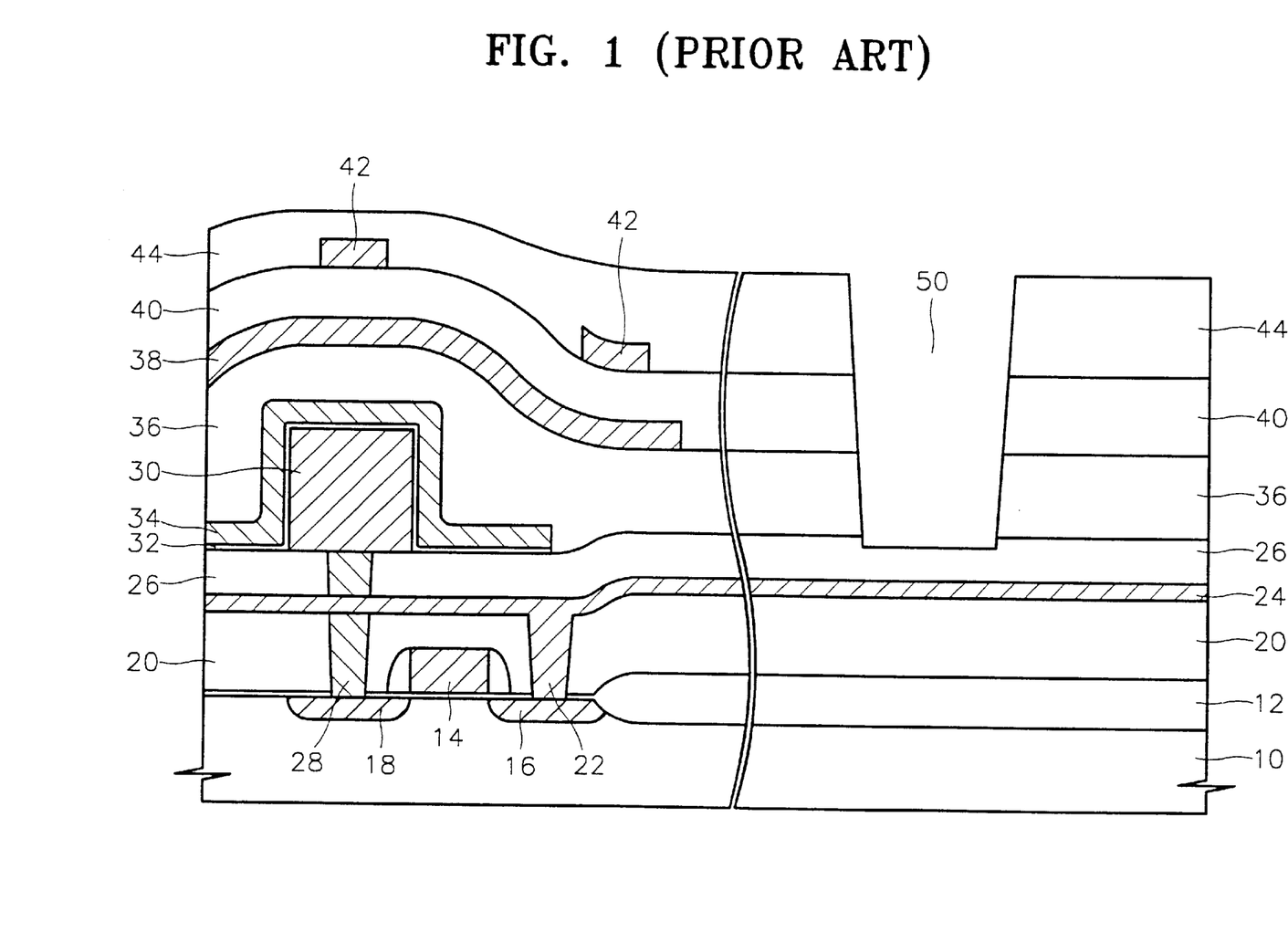
FIG. 1 is a schematic sectional view showing a fuse area structure of a conventional semiconductor device.

FIG. 1 is a sectional view showing part of a memory cell and a fuse area of a conventional semiconductor device, in particular, a DRAM device employing a multi-layer metal interconnection structure.

The left side of FIG. 1 shows a cell array area, which includes a memory cell constituted of a transistor 14, 16, and 18 and a capacitor 30, 32, and 34, multi-layer metal interconnections 38 and 42, interlayer dielectric films 20, 26, 36, and 40, and a passivation film 44. Also, the right side of FIG. 1 shows the fuse area, which includes a fuse line, that is, a bitline 24, connected to the drain region 16 of the transistor by a bitline contact plug 22 and a fuse opening 50 obtained by etching interlayer dielectric films 36 and 40 and the passivation film 44 on the fuse line 24 by a predetermined width. The laser is irradiated through the fuse opening 50 to cut the fuse line 24 under the fuse opening 50.

Here, each of the interlayer dielectric films 20, 26, 36, and 40 is described as a single-layer film. However, each can be a multiple-layer film obtained by stacking multiple layers. Also, a lower electrode contact plug 28 for electrically connecting a source region 18 of the transistor to the lower electrode 30 of the capacitor is located on a different plane to the plane on which the bitline 24 exists. That is, the lower electrode contact plug 28 does not contact the bitline 24. Here, it is described that the bitline 24 is used as the fuse line. However, the wordline 14 can be used as the fuse line. Another interconnection can be used as the fuse line in semiconductor devices other than memory devices. The above is also applied to the embodiments of the present invention, which will be described below.

Figure 2:
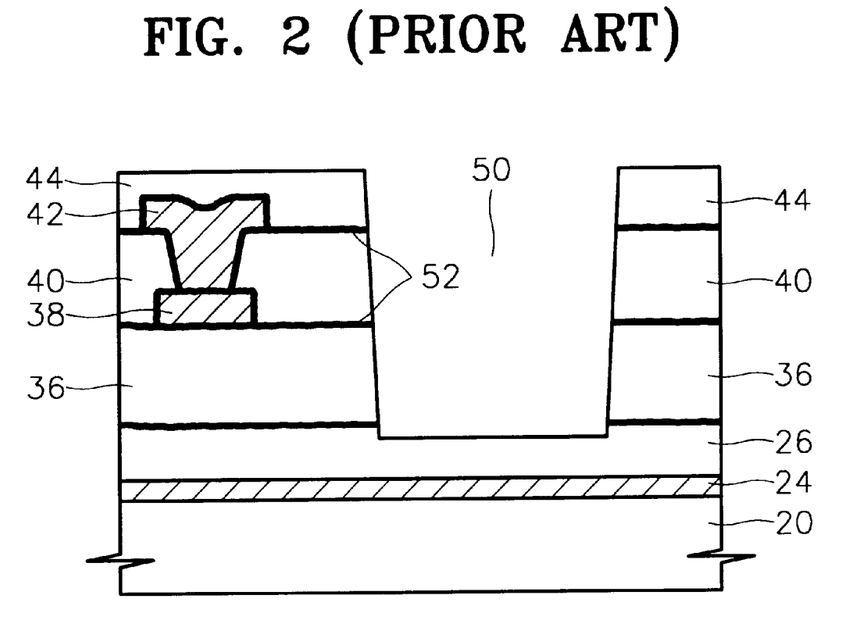
FIG. 2 is a schematic sectional view showing a case where moisture seeps into the interfaces between the interlayer dielectric films in the sidewall of the fuse opening shown in FIG. 1.

The fuse area of the general semiconductor device having the structure as shown in FIG. 1 exhibits certain problems. The interlayer dielectric films 26, 36, and 40 exposed on the sidewall of the fuse opening 50 are formed of silicon oxide, in particular, boron phosphorous silicate glass (BPSG), phosphorous silicate glass (PSG), spin on glass (SOG), tetra ethyl ortho silicate (TEOS), and undoped silicate glass (USG) which have an excellent step coverage, in order to reduce a large step difference between a cell array area and a peripheral circuit area. However, the BPSG, the PSG, the SOG, and the TEOS, which contain a large amount of impurities, for example, greater than or equal to 5 weight % of boron or greater than or equal to 4 weight % of phosphorous, are vulnerable to moisture. The reliability of a semiconductor device in which a fuse area was formed is tested at the temperature of between 100 and 150° C., under the humidity of between 80 and 100%, and under the pressure of between 1.5 and 3 atm. During this test, when moisture seeps into the interfaces between the interlayer dielectric films, which are vulnerable to moisture, as shown in FIG. 2, interfaces between metal interconnections 38 and 42 formed of tungsten or aluminum and the interlayer dielectric films 36 and 40 under the metal interconnections 38 and 42 in an adjacent peripheral circuit are peeled from each other as denoted by reference numeral 52. Accordingly, the electrical resistance of a metal contact increases and the reliability of the semiconductor device is severely deteriorated. It seems that because the energy level of the interface between the layers is lower than the energy level inside the respective layers that the moisture seeps into the interface between the interlayer dielectric films 26, 36, and 40 and the passivation film 44 and the interface between the interlayer dielectric films 36 and 40 and the metal interconnections 38 and 42.

Figure 3:
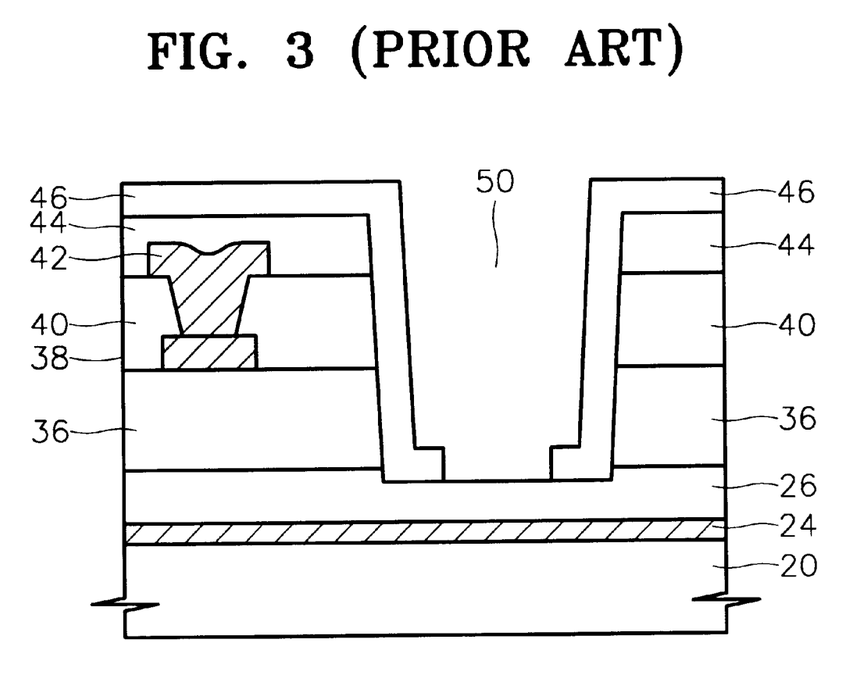
FIG. 3 is a schematic sectional view showing a fuse area in which a protection film is formed on the sidewall of the fuse opening according to a conventional method.

In order to solve this problem as shown in FIG. 3, a fuse area in which a protection film 46 is formed of a material such as silicon nitride on the sidewall of the fuse opening 50 is provided in the invention disclosed in U.S. Pat. No. 5,879,966. However, in order to form the protection film 46, a process of depositing the silicon nitride film on the passivation film 44 and a photolithography process of exposing the interlayer dielectric film 26 on the bottom of the fuse opening 50 must be additionally performed.

The fuse opening 50 shown in FIGS. 1 and 3 is formed by allowing a predetermined thickness of the interlayer dielectric film 26 to remain on the fuse line 24 by sequentially etching the passivation film 44 and the interlayer dielectric films 40, 36, and 26 after forming the passivation film 44 of the uppermost layer. Here, the films to be etched are significantly thick. Accordingly, it takes a long time to etch the films. Also, it is difficult to accurately control the thickness of the interlayer dielectric film 26 left on the fuse line 24.

SUMMARY OF THE INVENTION

To solve the above problems, it is an object of the present invention to provide a fuse area structure in a semiconductor device capable of preventing moisture from seeping into the sidewall of a fuse opening.

It is another object of the present invention to provide a method of forming a fuse area of a semiconductor device by which it is possible to form a protection film on the sidewall of a fuse opening without additional processes.

It is still another object of the present invention to provide a method of forming a fuse area of a semiconductor device by which it is possible to reduce the time taken for etching the fuse opening without additional processes and to accurately control the thickness of an interlayer dielectric film left on a fuse line.

In accordance with the invention, there is provided a fuse area structure in a semiconductor device. The structure includes a fuse line and a first interlayer dielectric film formed on the fuse line and exposed by a fuse opening. A second interlayer dielectric film is formed on the first interlayer dielectric film, and the fuse opening is formed in the second interlayer dielectric film. A passivation film, which operates as a protection film for preventing moisture from seeping into the sidewall of the fuse opening, is integrally formed on the uppermost layer of the semiconductor device, on the second interlayer dielectric film, and the sidewall of the fuse opening.

The passivation film can be formed of a moisture-proof film, such as a silicon nitride film, a silicon oxide film or a compound film of silicon nitride and silicon oxide films.

In one embodiment, the first interlayer dielectric film is recessed from the surface of the first interlayer dielectric film in a portion exposed by the fuse opening. An interface between the first and second interlayer dielectric films is exposed on the sidewall of the fuse opening. The passivation film covers the exposed interface between the first and second interlayer dielectric films.

In one embodiment, the first interlayer dielectric film is recessed from the surface of the first interlayer dielectric film at a portion where the passivation film which covers the sidewall of the fuse opening ends.

According to another aspect of the present invention, there is provided a method of forming a fuse area. In the method of forming the fuse area, a fuse line is formed. A first interlayer dielectric film is formed on the fuse line. A fuse opening etching stop film is formed on the first interlayer dielectric film using a predetermined material layer of a semiconductor device to be formed, to be slightly wider than an area in which a fuse opening is to be formed. A second interlayer dielectric film is formed on the etching stop film. A contact hole for the semiconductor device is formed by etching the second interlayer dielectric film. A fuse opening for exposing the etching stop film is formed at the same time in the fuse area. An upper interconnection layer of the semiconductor device is formed by depositing a conductive material on the entire surface of each of the contact hole, the fuse opening and the second interlayer dielectric film and patterning the conductive material and removing the conductive material formed on the fuse opening at the same time. The first interlayer dielectric film is exposed by removing the etching stop film exposed to the fuse opening. The passivation film is formed on the entire surface of each of the upper interconnection layer, the fuse opening, and the second interlayer dielectric film. Finally, the first interlayer dielectric film is exposed by removing the passivation film deposited on the bottom of the fuse opening.

According to another aspect of the present invention, there is provided another method of forming a fuse area. In the method of forming the fuse area, a fuse line is formed. A first interlayer dielectric film is formed on the fuse line. A fuse opening etching stop film is formed on the first interlayer dielectric film using a predetermined material layer of a semiconductor device to be formed, to be slightly wider than an area in which a fuse opening is to be formed. A second interlayer dielectric film is formed on the etching stop film. A lower interconnection layer is formed on the second interlayer dielectric film in a region excluding the fuse area of the semiconductor device. A third interlayer dielectric film is formed on the lower interconnection layer. A contact hole which exposes the lower interconnection layer is formed by etching the third interlayer dielectric film. At the same time, a fuse opening which exposes the etching stop film is formed by sequentially etching the third and second interlayer dielectric films in the fuse area. A conductive material which will form an upper interconnection layer of the semiconductor device is formed on the entire surface of each of the contact hole, the fuse opening, and the third interlayer dielectric film. The conductive material layer is patterned, and the conductive material deposited on the fuse opening is removed. The first interlayer dielectric film is exposed by removing the etching stop film exposed to the fuse opening, and the passivation film is formed on the entire surface of each of the upper interconnection layer, the fuse opening, and the third interlayer dielectric film. The first interlayer dielectric film is exposed by removing the passivation film deposited on the bottom of the fuse opening.

The conductive material deposited on the fuse opening and the etching stop film under the conductive material can be successively removed using etching gas or etching solution having low selectivity.

The etching stop film can be removed after removing the passivation film on the bottom of the fuse opening.

The interface between the first interlayer dielectric film and the etching stop film is exposed on the sidewall of the fuse opening by slightly overetching the etching stop film of the fuse opening.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DESCRIPTION OF THE PREFERRED EMBODIMENTS

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete. In the drawings, it will also be understood that when a layer is referred to as being on another layer or substrate, it can be directly on the other layer or substrate, or intervening layers may also be present.

FIGS. 4 through 7 are sectional views showing processes of forming a fuse area of a semiconductor device according to an embodiment of the present invention and the structure of the fuse area formed thereby.

Figure 4:
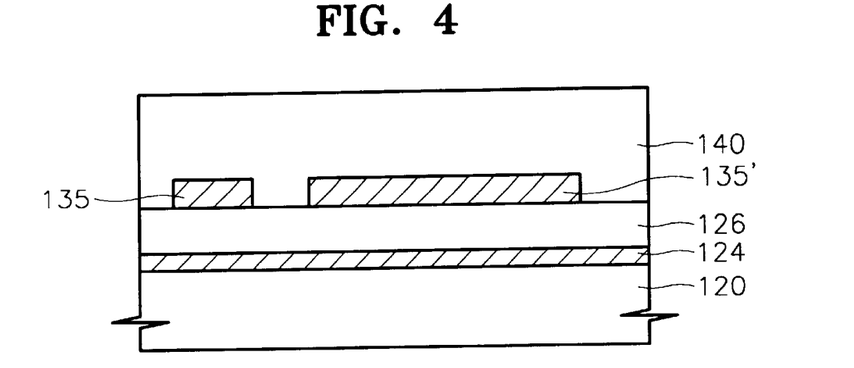
FIGS. 4 through 7 are schematic sectional views showing processes of forming a fuse area and the structure of the fuse area formed thereby according to an embodiment of the present invention.

FIG. 4 shows a stage at which an etching stop film is formed. The etching stop film is to be used when the fuse opening is formed.

Referring to FIG. 4, a fuse line 124 is formed on a substrate or an interlayer dielectric film 120 by a general method. The fuse line 124 becomes a predetermined conductive layer of the semiconductor device to be cut if necessary. An interlayer dielectric film 126 is deposited on the entire surface of the fuse line 124. In one embodiment, the interlayer dielectric film 126 is formed of silicon oxide to a thickness of between 2,000 and 5,000 Å. The interlayer dielectric film 126 is an insulating film, a predetermined thickness of which is to be left on the fuse line 124, which is to be cut by the irradiation of laser in the structure (refer to FIG. 7) of the completed fuse area. The interlayer dielectric film 126 can be formed of materials other than the silicon oxide and the thickness thereof can vary.

A predetermined conductive layer 135 of the semiconductor device is formed by depositing a conductive material on the interlayer dielectric film 126 and patterning the deposited conductive material. In the fuse area, at the same time, an etching stop film 135' to be used during the formation of the fuse opening is formed. The etching stop film 135' can be formed of various layers. For example, in a DRAM device, a layer which forms an upper electrode of a capacitor can be used as the etching stop film 135'. A predetermined interconnection layer can be used as the etching stop film 135' in a DRAM device, a SRAM device, and an integrated circuit used for specific applications. Therefore, the etching stop film 135' can be formed of polycrystalline silicon doped with impurities, aluminum, or tungsten. In FIG. 4, the conductive layer 135 and the etching stop film 135' are shown as being formed of the same material and to have the same height. However, the conductive layer 135 and the etching stop film 135' can be formed of different materials to have different heights. An interlayer dielectric film 140 can be formed of a silicon oxide layer.

Figure 5:
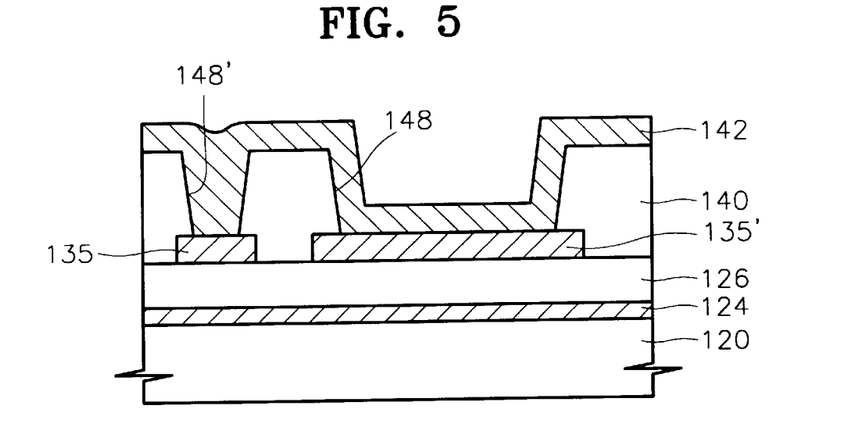

As shown in FIG. 5, a fuse opening 148 is formed by etching the interlayer dielectric film 140 until the etching stop film 135' is exposed. It is preferable that the fuse opening 148 is formed in a process of etching the interlayer dielectric film 140 for forming a contact hole 148' required for a device, so that an additional process is not required. When the conductive layer 135 and the etching stop film 135' are formed of different materials having different heights as mentioned above, the fuse opening 148 and the contact hole 148' have different depths. However, the fuse opening 148 and the contact hole 148' can be simultaneously formed by etching the interlayer dielectric film 140 until the etching stop film 135' and the conductive layer 135 are exposed, respectively.

When a conductive material such as aluminum or tungsten is deposited on the entire surface in order to form an upper interconnection layer, a conductive material layer 142 which fills the contact hole 148' is formed and the conductive material layer 142 is formed also in the fuse opening 148, as shown in FIG. 5.

Figure 6:
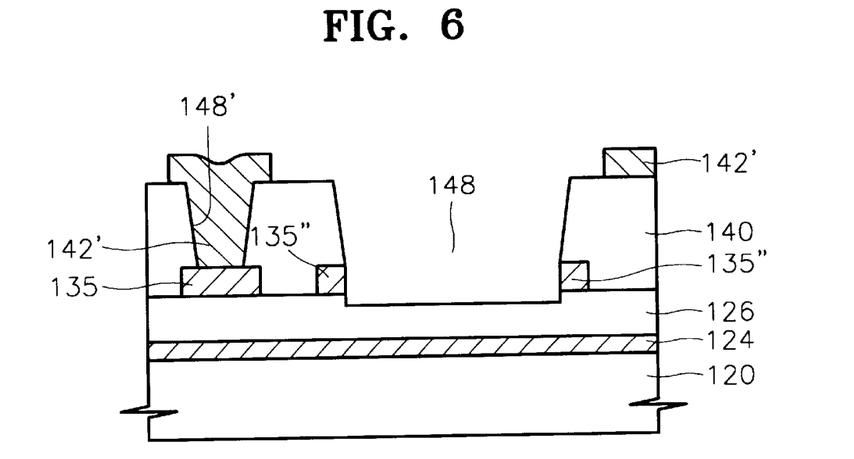

Referring to FIG. 6, an upper interconnection layer 142' is formed by patterning the conductive material layer 142 formed on the entire surface of the substrate, and the conductive material in the fuse opening 148 is removed. The etching stop film 135' exposed to the fuse opening 148 is removed since the conductive material layer 142 is removed, and a small amount of etching stop film 135" is left around the fuse opening 148.

The conductive material layer 142 formed in the fuse opening 148 and the etching stop film 135' can be removed by a two-step etching process using an etching gas or an etching solution. When the conductive material layer 142 and the etching stop film 135' are formed of the same material, the conductive material layer 142 and the etching stop film 135' can be removed by one step of etching the conductive material layer 142. Also, even when the conductive material layer 142 and the etching stop film 135' are formed of different materials, it is preferable that the conductive material layer 142 and the etching stop film 135' are successively etched using an etching gas or etching solution having a low etching selectivity with respect to the two materials that form the conductive material layer 142 and the etching stop film 135', such that the conductive material layer 142 and the etching stop film 135' are removed. For example, when the conductive material layer 142 and the etching stop film 135' are formed of aluminum and polycrystalline silicon, respectively, polycrystalline silicon reacts wit aluminum due to the heat generated when aluminum is deposited and reflowed thus being metalized (it is possible to observe by a scanning electron microscope that polycrystalline silicon is metalized). Therefore, the metalized polycrystalline silicon is removed in a process of plasma etching aluminum under a pressure of between 100 and 250 mTorr and an RF power of between 300 and 700 W for between 100 and 160 seconds, using $BCl_3$ having a flow rate of between 35 and 60 sccm and $Cl_2$, having a flow rate of between 30 through 50 sccm as etching gases and flowing $N_2$ of between 10 and 25 sccm.

In one embodiment, the interlayer dielectric film 126 is recessed under the conductive material layer 142 and the etching stop film 135' of the fuse opening 148 by slightly overetching the conductive material layer 142 and the etching stop film 135' of the fuse opening 148. This is to completely block a moisture-absorption path by forming a protection film for preventing the seeping of moisture, on the sidewall of the fuse opening 148 in the following process after exposing the interface between the interlayer dielectric film 126 and the remaining etching stop film 135" which can be a moisture-absorption path in the sidewall of the fuse opening 148. Also, the thickness of the interlayer dielectric film 126 left on the fuse line 124 is controlled to have a thickness that can be efficiently cut by a laser, that is, between 500 and 10,000 Å, preferably, between 1,500 and 4,500 Å by overetching the conductive material layer 142 and the etching stop film 135' of the fuse opening 148.

In this embodiment of the present invention, the etching stop film 135' exposed on the bottom of the fuse opening 148 is removed when the upper interconnection layer 142' is formed. However, the etching stop film 135' can be removed later. That is, it is possible to remove only the conductive material layer 142 deposited on the fuse opening 148, to form a passivation film 144 on the etching stop film 135', and then to remove the etching stop film 135' exposed in the following process (refer to FIG. 7) of removing the passivation film 144 formed on the bottom of the fuse opening 148.

Figure 7:
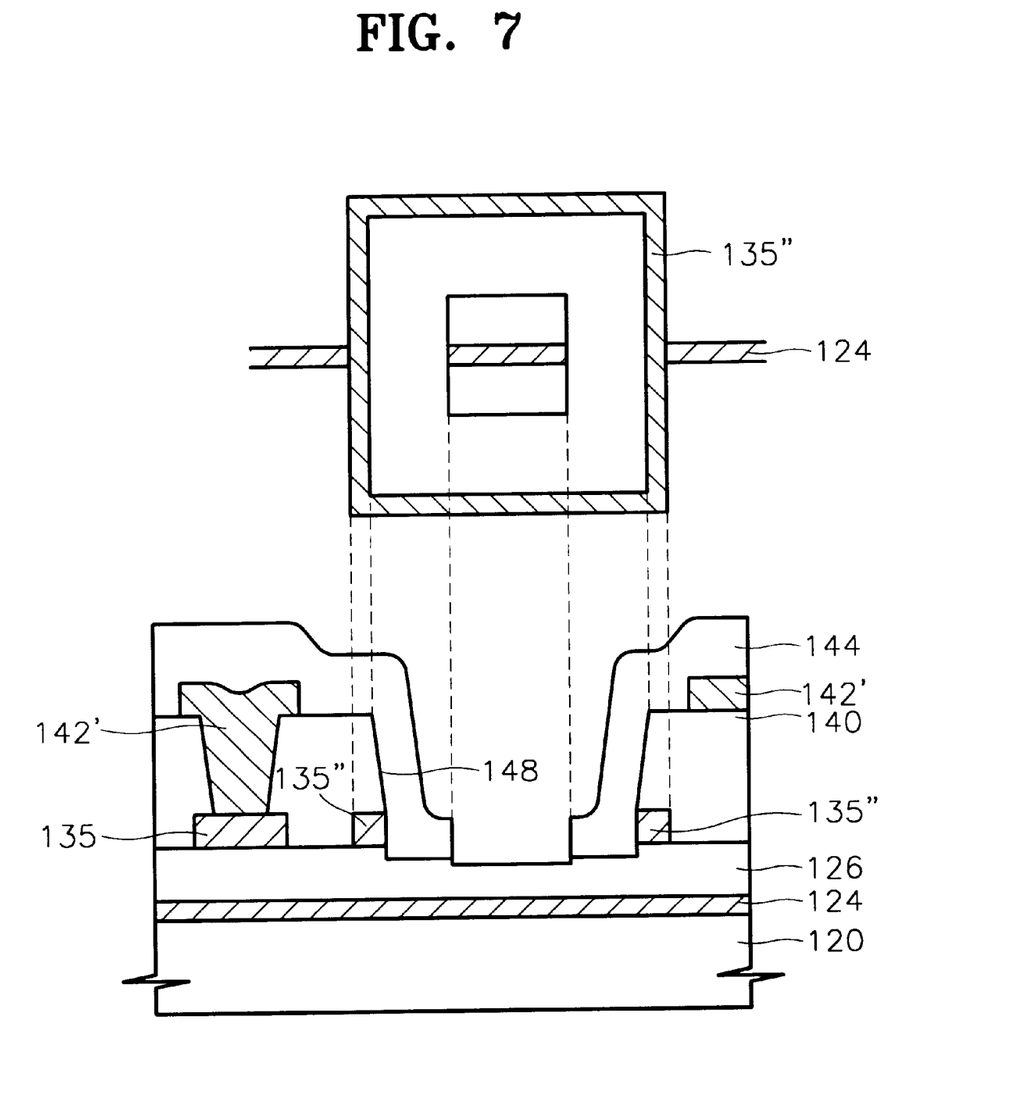

In order to form the fuse area having the structure shown in FIG. 7, the passivation film 144 is formed on the entire surface of the resultant structure of FIG. 6 of a moisture-proof film, that is, a silicon nitride film, a silicon oxide film that is not doped with impurities or doped with a low concentration of impurities, or a compound film of the above films. Then, the interface between the interlayer dielectric films 126 and 140, which can be a moisture-absorption path, is surrounded by the passivation film 144. Accordingly, the moisture-absorption path is blocked.

The fuse area is completed by removing the passivation film deposited in the center of the bottom of the fuse opening 148 into which laser is to be irradiated, thus exposing the interlayer dielectric film 126. It is preferable that the interlayer dielectric film 126 on the bottom of the fuse opening 148 is exposed in a process of exposing the upper interconnection layer 142' by etching the passivation film 144 in order to form a bonding pad (not shown) for wire bonding, so that an additional process is not required.

Meanwhile, it is possible to control the thickness of the interlayer dielectric film 126 left on the fuse line 124 to be appropriate by slightly overetching the passivation film 144 on the bottom of the fuse opening 148.

Referring to FIG. 7, in the fuse area according to the present embodiment, a passivation film 144 is integrally formed on the uppermost layer of the device and the sidewall of the fuse opening 148. The interlayer dielectric film 126 is exposed in a portion into which laser is to be irradiated, that is, in the center of the bottom of the fuse opening 148. The interlayer dielectric film 126 is slightly recessed at the edge of the fuse opening 148 from the surface thereof. Accordingly, the interface between the interlayer dielectric film 126 and the interlayer dielectric film 140 is exposed on the sidewall of the fuse opening 148 and the exposed interface is covered with the passivation film 144. Accordingly, it is possible to completely prevent moisture from seeping into the interface. Also, the interlayer dielectric film 126 in the center of the fuse opening 148 is slightly recessed. Accordingly, an interlayer dielectric film having an appropriate thickness is left on the fuse line 124.

In the fuse area having a plane layout as shown in the upper portion of FIG. 7, only one fuse line 124 passes through one fuse opening 148. However, a plurality of fuse lines 124 can pass through one fuse opening 148.

FIGS. 8 through 11 are sectional views showing processes of forming a fuse area according to another embodiment of the present invention and the structure of the fuse area formed thereby. In the present embodiment, the present invention is applied to the DRAM device.

Figure 8:
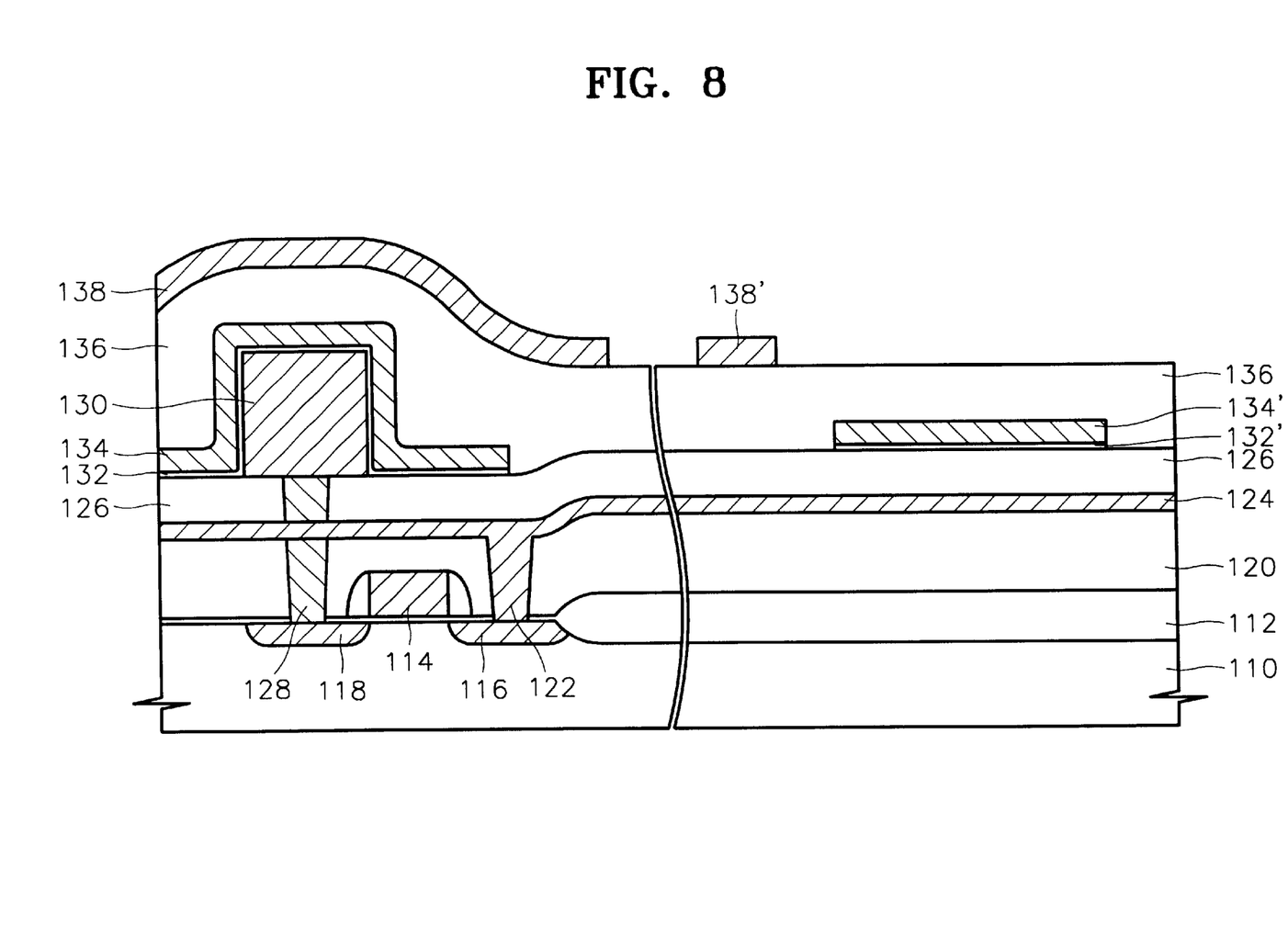
FIGS. 8 through 11 are schematic sectional views showing processes of forming a fuse area and the structure of the fuse area formed thereby according to another embodiment of the present invention.

FIG. 8 shows a stage at which the lower interconnection layer of the DRAM device is formed. The fuse area of the present embodiment and a cell array area are simultaneously formed. That is, an interlayer dielectric film 120 is formed on the entire surface of the substrate by a general method, after forming an isolation film 112 on a substrate 110, a gate electrode 114 of a transistor, and source/drain regions 118/116. A contact hole which exposes the drain region 116 is formed by etching the interlayer dielectric film 120. A contact plug 122 and the bitline 124 are formed by depositing and patterning a conductive material such as polycrystalline silicon doped with impurities, metal silicide, or a film obtained by stacking polycrystalline silicon and metal silicide after forming the contact hole which exposes the drain region 116 by etching the interlayer dielectric film 120. The bitline 124 forms the fuse line in the fuse area on the right side of FIG. 8. As mentioned above, the fuse line can be formed of a wordline 114 and can be extended to be convex or concave in order to control the height of the fuse area.

The interlayer dielectric film 126 is deposited on the entire surface of the bit line (fuse line) 124. The interlayer dielectric film 126 is formed of silicon oxide to a thickness of between 2,000 and 5,000 Å. A contact hole which exposes a source region 118 is formed by etching the interlayer dielectric films 126 and 120. After forming a contact plug 128 in the contact hole by depositing a conductive material, for example, polycrystalline silicon doped with impurities, a lower electrode 130 of a capacitor is formed on the contact plug 128. In FIG. 8, the lower electrode 130, which is shown as a simple box type. However, the lower electrode 130 can be in various forms such as a cylinder and a fin. Hemispherical grains can be formed on the surface of the lower electrode 130. A dielectric film 132 is formed on the entire surface of the lower electrode 130 and a conductive material such as polycrystalline silicon doped with impurities is deposited on the dielectric film 132 to a thickness of between 1,250 and 1,550 Å, thus forming an upper electrode layer.

The upper electrode layer is patterned, thus forming an upper electrode 134. Here, the upper electrode layer is patterned so as to be left a little wider than an area on which laser is to be irradiated, that is, a fuse opening to be formed on the right side of FIG. 8. An upper electrode layer pattern 134' left in the fuse area operates as an etching stop film when the interlayer dielectric film is etched for forming the fuse opening is etched. When the upper electrode layer is formed of polycrystalline silicon, the upper electrode layer can be etched by performing plasma etching, under a pressure of between 30 and 50 mTorr and an RF power of between 120 and 150 W for between 50 and 70 seconds, using $Cl_2$ having a flow rate of between 30 and 50 sccm and $SF_6$ having a flow rate of between 10 and 20 sccm as etching gases.

An interlayer dielectric film 136 is formed of silicon oxide having an excellent step coverage, on which the upper electrode 134 and lower interconnection layer 138 and 138' is formed. The lower interconnection layer 138 and 138' is formed by depositing a conductive material, for example, a metal such as tungsten or aluminum (a barrier metal layer can be included under the metal layer when the metal is used) on the entire surface of the interlayer dielectric film 136 and by patterning the metal to have a desired interconnection pattern. The conductive material is removed in the fuse area.

Figure 9:
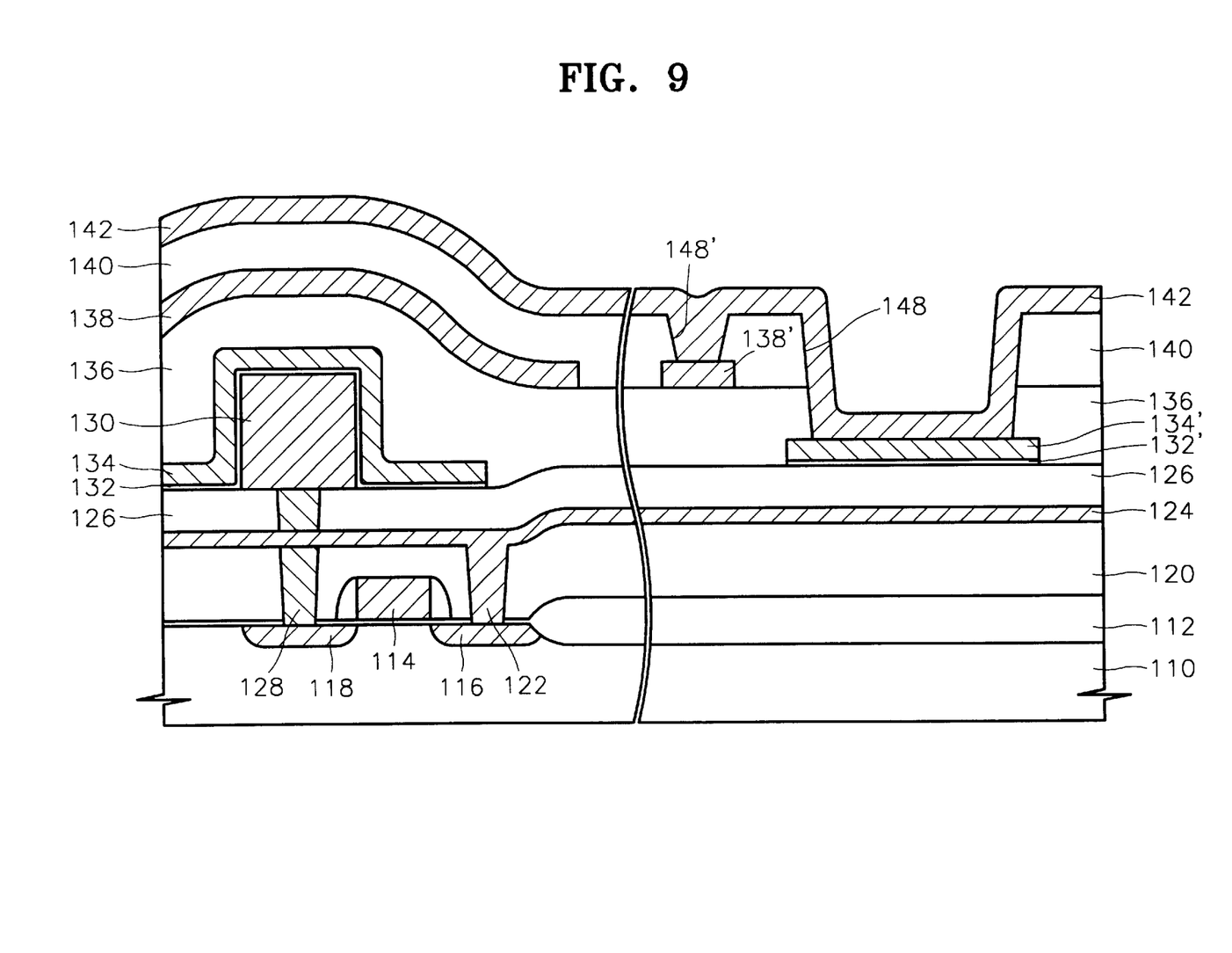

As shown in FIG. 9, a silicon oxide film as an interlayer dielectric film 140 is deposited on the entire surface of the resultant structure of FIG. 8 and the deposited silicon oxide film is etched. A contact hole 148' required for, for example, a sense amplifier or a split wordline drive in the peripheral circuit area is formed. When forming the contact hole 148', the fuse opening 148 is simultaneously formed by sequentially etching the interlayer dielectric films 140 and 136 until the etching stop film 134' is exposed. The contact hole 148' and the fuse opening 148 are etched to have different depths. However, they can be simultaneously formed by being etched until the lower interconnection layer 138' and the etching stop film 134' are exposed, respectively. In one specific example, the contact hole 148' and the fuse opening 148 can be simultaneously formed by plasma etching the interlayer dielectric films 140 and 136 formed of silicon oxide under the pressure of between 300 and 500 mTorr and an RF power of between 1,100 and 1,400 W for between 100 and 150 seconds, using $CF_4$ having a flow rate of between 35 and 50 sccm and $CHF_3$ having a flow rate of between 35 and 50 sccm as etching gases, flowing Ar having a flow rate of between 300 and 450 sccm.

When a conductive material, for example, a metal such as aluminum or tungsten is deposited to a thickness of between 6,500 and 10,000 Å in order to form an upper interconnection layer on the entire surface of the substrate, a conductive material layer 142 which fills the contact hole 148' is formed and the conductive material layer 142 is formed also in the fuse opening 148.

Figure 10:
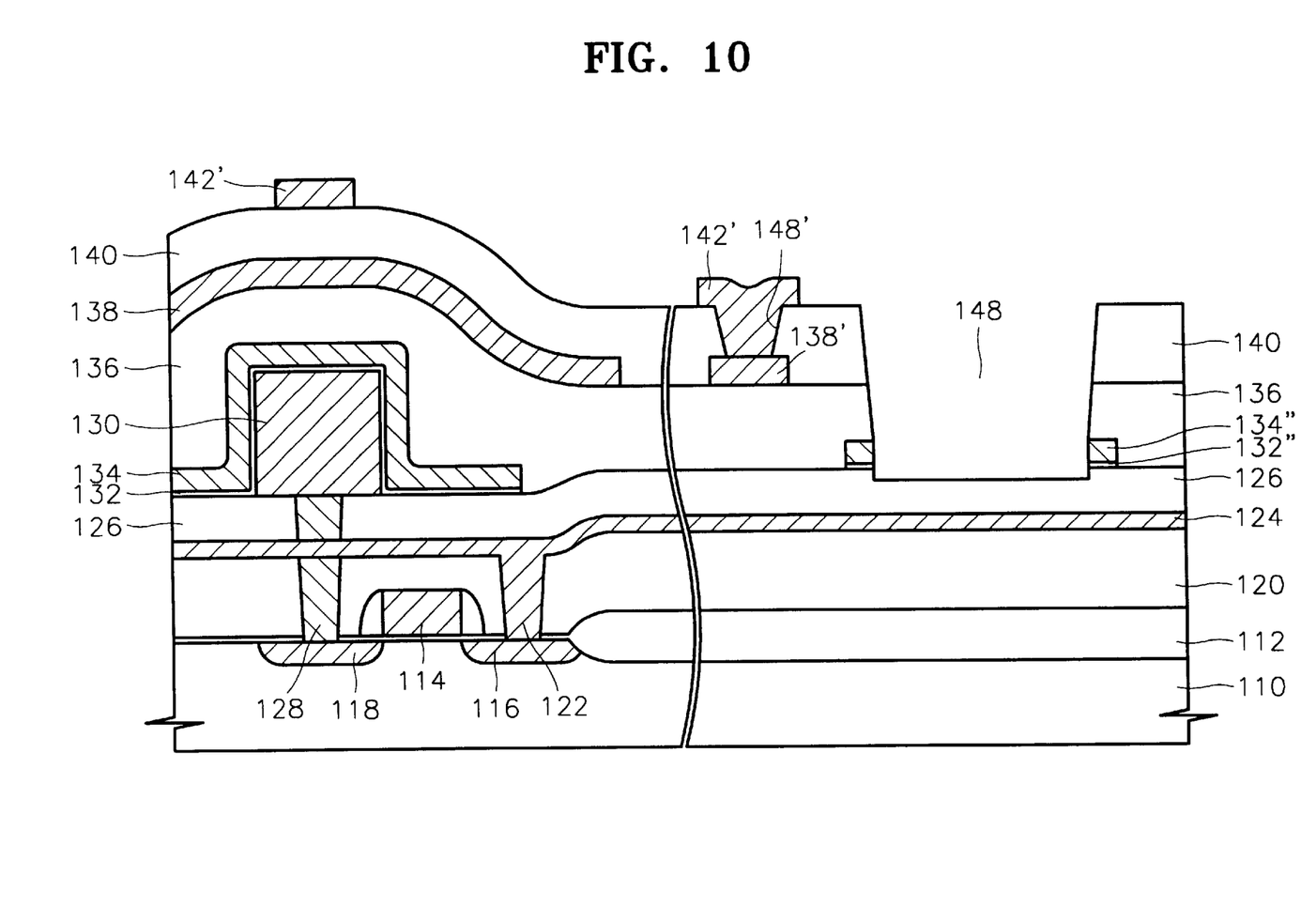

Referring to FIG. 10, the conductive material layer 142 formed on the entire surface of the substrate is patterned, thus forming the upper interconnection layer 142', and the conductive material is completely removed in the fuse opening 148. The etching stop film 134' exposed to the fuse opening 148 by removing the conductive material layer 142 is removed. Only a small amount of the etching stop film 134" is left around the fuse opening 148.

The conductive material layer 142 formed in the fuse opening 148 and the etching stop film 134' can be removed by two-step etching using an etching gas or an etching solution. However, it is convenient to remove the conductive material film 142 and the etching stop film 134' by successively etching the conductive material film 142 and the etching stop film 134' using an etching gas or an etching solution having low etching selectivity with respect to the conductive material film 142 and the etching stop film 134'. Namely, for example, when the conductive material layer 142 and the etching stop film 134' are formed of aluminum and polycrystalline silicon, respectively, polycrystalline silicon reacts with aluminum due to heat generated when aluminum is deposited and reflown, thus being metalized. Therefore, the metalized polycrystalline silicon is removed in a process of plasma etching aluminum under a pressure of between 100 and 250 mTorr and an RF power of between 300 and 700 W for between 100 and 160 seconds, using $BCl_3$ having a flow rate of between 35 and 60 sccm and $Cl_2$ having a flow rate of between 30 and 50 sccm as etching gases and flowing $N_2$ having a flow rate of between 10 and 25 sccm.

The conductive material layer 142 and the etching stop film 134' of the fuse opening 148 can be slightly overetched. Accordingly, it is possible to recess the interlayer dielectric film 126 from the surface thereof to a predetermined thickness. This is for completely blocking the moisture-absorption path by forming the protection film for preventing the seeping of moisture on the sidewall of the fuse opening 148 in the following process after exposing the interface between the interlayer dielectric film 126 and the remaining etching stop film 134", which is a possible moisture-absorption path from the sidewall of the fuse opening 148. Also, the interlayer dielectric film 126 left on the fuse line 124 is controlled to have a thickness that can be efficiently cut by a laser, that is, between 500 and 10,000 Å, preferably, between 1,500 and 4,500 Å, by overetching the conductive material layer 142 and the etching stop film 134' of the fuse opening 148.

In this embodiment of the present invention, the etching stop film 134' exposed at the bottom of the fuse opening 148 is removed when the upper interconnection layer 142' is formed. However, the etching stop film 134' can be removed later. It is possible to remove only the conductive material layer 142 deposited on the fuse opening 148, to form a passivation film 144 on the fuse opening 148, and then to remove the etching stop film 134' exposed in the process (refer to FIG. 11) of removing the passivation film 144 formed on the bottom of the fuse opening 148.

Figure 11:
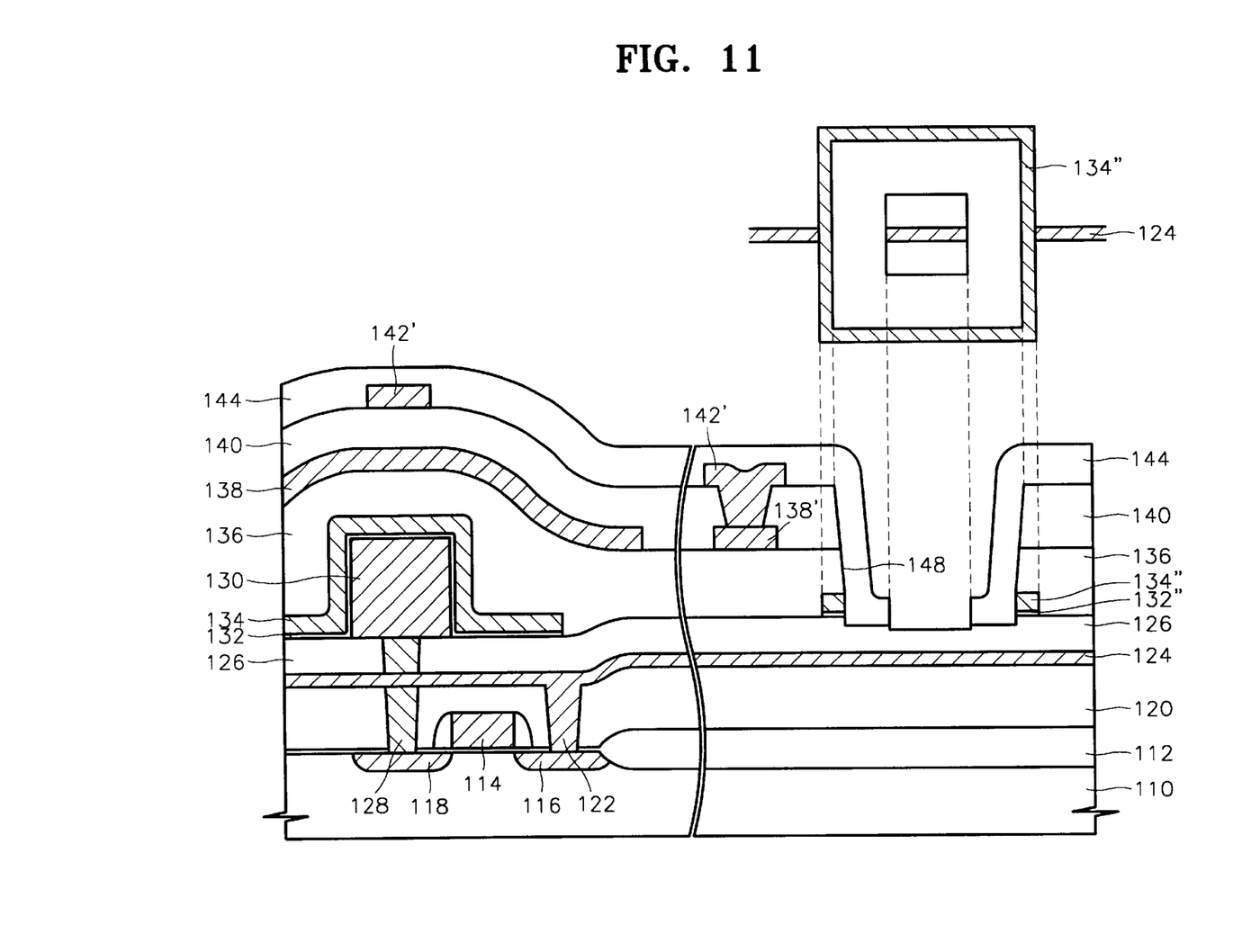

Referring to FIG. 11, the passivation film 144 is integrally formed on the uppermost layer of the device and the sidewall of the fuse opening 148. The interlayer dielectric film 126 is exposed in the portion into which laser is to be irradiated, that is, in the center of the bottom of the fuse opening 148. In the fuse area having the plane layout as shown in the right upper portion of FIG. 11, only one fuse line 124 passes through one fuse opening 148. However, a plurality of fuse lines 124 can pass through one fuse opening 148.

In order to form the fuse area having the structure shown in FIG. 11, the moisture-proof film, that is, a silicon nitride film, a silicon oxide film which is not doped with impurities or doped with a low concentration of impurities, or a compound film of the above films is formed on the entire surface of the resultant structure of FIG. 10. In the present embodiment, the silicon oxide layer, which is not doped with impurities, is deposited to a thickness of between 1,000 and 2,000 Å. Then, the silicon nitride film is deposited on the silicon oxide film to a thickness of between 5,000 and 10,000 Å. Then, the interfaces between the interlayer dielectric films 126 and 136, and 136 and 140, which can be moisture-absorption paths, are surrounded by the passivation film 144. Accordingly, the moisture-absorption paths are blocked.

The fuse area is completed by removing the passivation film deposited in the center of the bottom of the fuse opening 148 into which laser is to be irradiated, thus exposing the interlayer dielectric film 126. It is preferable that the interlayer dielectric film 126 at the bottom of the fuse opening 148 is exposed in a process of exposing the upper interconnection layer 142' by etching the passivation film 144 in order to form a bonding pad (not shown) for wire bonding, so that an additional process is not required. That is, the fuse area in which the interlayer dielectric film 126 is exposed is formed by plasma etching the passivation film 144 under a pressure of between 300 and 500 mTorr and an RF power of between 1,000 and 1,300 W for between 60 and 95 seconds, using $CF_4$ having a flow rate of between 65 and 90 sccm and $O_2$ having a flow rate of between 10 and 25 sccm as etching gases and flowing Ar having a flow rate of between 80 and 110 sccm.

When the passivation film 144 on the bottom of the fuse opening 148 is etched, thus being removed, it is possible to control the thickness of the interlayer dielectric film 126 left on the fuse line 124 to be appropriate again by slightly overetching the passivation film 144, thus slightly etching the interlayer dielectric film 126.

In the above-mentioned present invention, the etching stop film 134' is formed of the same layer as the upper electrode of the capacitor. However, the etching stop film 134' can be formed of the lower interconnection layer on the upper electrode of the capacitor or another conductive layer.

As mentioned above, according to the present invention, moisture is prevented from seeping into the sidewall of the fuse opening since the protection film is formed on the sidewall of the fuse opening. In particular, according to the present invention, the protection film can be formed on the sidewall of the fuse opening using a conventional process of forming a semiconductor device, so that an additional process is not required. Furthermore, in the present invention, the fuse opening is simultaneously formed in the process of forming the contact hole of the peripheral circuit by etching the interlayer dielectric films, unlike in the conventional method of forming the fuse opening by etching the passivation film and the interlayer dielectric films after forming the passivation film. Therefore, equipment and time required for forming the fuse opening are saved, compared with the conventional process of forming the fuse opening by forming the passivation film and etching the passivation film and the interlayer dielectric films, to thus improve productivity in a mass production system.

According to the present invention, the thickness of the interlayer dielectric film left on the fuse line is controlled to be appropriate since the depth to which the fuse opening is formed is reduced by forming the fuse opening before finally forming the passivation film, as mentioned above and using the etching stop film during the formation of the fuse opening.

While this invention has been particularly shown and described with references to preferred embodiments thereof, it will be understood by those skilled in the art that various changes in form and details may be made therein without departing from the spirit and scope of the invention as defined by the following claims.

What is claimed is:

1. A method of forming a fuse area, comprising the steps of:

forming a fuse line;

forming a first interlayer dielectric film on the fuse line;

forming a fuse opening etching stop film on the first interlayer dielectric film using a predetermined material layer of a semiconductor device to be formed to be slightly wider than an area in which a fuse opening is to be formed;

forming a second interlayer dielectric film on the etching stop film;

forming a contact hole for the semiconductor device by etching the second interlayer dielectric film and forming a fuse opening exposing the etching stop film at the same time;

forming a conductive material layer on the entire surface of each of the contact hole, the fuse opening, and the second interlayer dielectric film;

forming an upper interconnection layer of the semiconductor device by patterning the conductive material layer and removing a conductive material layer formed on the fuse opening at the same time;

removing the etching stop film exposed to the fuse opening;

forming a passivation film on the entire surface of each of the upper interconnection layer, the fuse opening, and the second interlayer dielectric film; and exposing the first interlayer dielectric film by removing the passivation film formed on the bottom of the fuse opening.

2. The method of claim 1, wherein the passivation film is formed of one of a silicon nitride film, a silicon oxide film, and a compound film of silicon nitride and silicon oxide films.

3. The method of claim 1, wherein the step of removing the conductive material layer formed on the fuse opening and the step of removing the etching stop film are successively performed.

4. The method of claim 1, wherein an interface between the first interlayer dielectric film and the etching stop film is exposed on the sidewall of the fuse opening by slightly overetching the etching stop film in the step of removing the etching stop film.

5. The method of claim 1, wherein the step of removing the etching stop film is successively performed after the step of removing the passivation film formed on the bottom of the fuse opening.

6. The method of claim 1, wherein the thickness of the first interlayer dielectric film left on the fuse line is between 500 and 10,000 Å by slightly overetching the passivation film in the step of removing the passivation film formed on the bottom of the fuse opening.

7. A method of forming a fuse area, comprising the steps of:

forming a fuse line;

forming a first interlayer dielectric film on the fuse line;

forming a fuse opening etching stop film on the first interlayer dielectric film using a predetermined material layer of a semiconductor device to be formed, to be slightly wider than an area in which a fuse opening is to be formed;

forming a second interlayer dielectric film on the etching stop film;

forming a lower interconnection layer on the second interlayer dielectric film in a region excluding the fuse area of the semiconductor device;

forming a third interlayer dielectric film on the lower interconnection layer;

forming a contact hole which exposes the lower interconnection layer by etching the third interlayer dielectric film and, at the same time, forming a fuse opening which exposes the etching stop film by sequentially etching the third and second interlayer dielectric films;

forming a conductive material layer which will form an upper interconnection layer of the semiconductor device on the entire surface of each of the contact hole, the fuse opening, and the third interlayer dielectric film;

forming the upper interconnection layer by patterning the conductive material layer and removing the conductive material layer formed on the fuse opening;

removing the etching stop film exposed by the fuse opening;

forming a passivation film on the entire surface of each of the upper interconnection layer, the fuse opening, and the third interlayer dielectric film; and exposing the first interlayer dielectric film by removing the passivation film formed on the bottom of the fuse opening.

8. The method of claim 7, wherein the passivation film is formed of one of a silicon nitride film, a silicon oxide film, and a compound film of silicon nitride and silicon oxide films.

9. The method of claim 7, wherein the etching stop film and the lower interconnection layer are simultaneously formed of the same material.

10. The method of claim 7, wherein the semiconductor device is a DRAM device and the etching stop film and a conductive layer, which forms the capacitor upper electrode of the DRAM device, are simultaneously formed of the same material.

11. The method of claim 7, wherein the conductive material layer and the etching stop film are successively removed using etching gas or etching solution having low selectivity with respect to a material which forms the conductive material layer and a material layer which forms the etching stop film, in the steps of removing the conductive material layer used as the upper interconnection layer formed on the fuse opening and removing the etching stop film.

12. The method of claim 7, wherein the interface between the first interlayer dielectric film and the etching stop film is exposed on the sidewall of the fuse opening by slightly overetching the etching stop film in the step of removing the etching stop film.

13. The method of claim 7, wherein the step of removing the etching stop film is successively performed after the step of removing the passivation film formed on the bottom of the fuse opening.

14. The method of claim 7, wherein the thickness of the first interlayer dielectric film left on the fuse line is between 500 and 10,000 Å by slightly overetching the passivation film in the step of removing the passivation film formed on the bottom of the fuse opening.

* * * * *